United States Patent [19]
Smith et al.

[11] Patent Number: 5,917,401
[45] Date of Patent: Jun. 29, 1999

[54] CONDUCTIVE BUS MEMBER AND METHOD OF FABRICATING SAME

[75] Inventors: Edward W. Smith, Pecatonica; Arthur A. Pershall, Rockford; Mark W. Metzler, Davis, all of Ill.

[73] Assignee: Sundstrand Corporation, Rockford, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/806,962

[22] Filed: Feb. 26, 1997

[51] Int. Cl.$^6$ ........................................... H01C 7/00
[52] U.S. Cl. .......................... 338/49; 29/610.1; 324/126; 338/48
[58] Field of Search ................................ 338/48, 49, 322; 29/610.1; 324/126

[56] References Cited

U.S. PATENT DOCUMENTS

| | | | |
|---|---|---|---|
| 1,084,721 | 1/1914 | Willis | 324/126 |
| 1,861,434 | 1/1932 | Campbell | 338/287 |
| 2,023,517 | 12/1935 | Creager et al. | 338/319 |
| 3,234,461 | 2/1966 | Trent et al. | 324/126 |
| 3,372,334 | 3/1968 | Fenoglio et al. | 324/126 |
| 4,182,982 | 1/1980 | Wolf et al. | 324/127 |
| 4,240,059 | 12/1980 | Wolf et al. | 338/49 |
| 4,339,743 | 7/1982 | Ludwig | 338/206 |
| 4,506,214 | 3/1985 | Lienhard et al. | 324/117 R |
| 4,559,495 | 12/1985 | Lienhard | 324/117 R |
| 4,749,940 | 6/1988 | Bullock | 324/127 |
| 4,794,326 | 12/1988 | Friedl | 324/117 R |
| 4,835,463 | 5/1989 | Baran et al. | 324/123 R |
| 4,893,073 | 1/1990 | McDonald et al. | 324/117 H |
| 4,939,451 | 7/1990 | Baran et al. | 324/127 |
| 5,027,059 | 6/1991 | Montgolfier et al. | 324/127 |
| 5,214,407 | 5/1993 | McKim, Jr. et al. | 338/49 |
| 5,223,790 | 6/1993 | Baran et al. | 324/127 |
| 5,438,257 | 8/1995 | Berkcan | 324/117 R |
| 5,561,366 | 10/1996 | Takahashi et al. | 324/117 R |

FOREIGN PATENT DOCUMENTS

| | | |
|---|---|---|
| 2 619 925 | 3/1989 | France . |
| 40 23 614 A1 | 1/1992 | Germany . |
| 57-037268 | 3/1982 | Japan . |
| 178126 | 4/1922 | United Kingdom ................... 324/126 |
| 924392 | 4/1963 | United Kingdom ................... 338/322 |

OTHER PUBLICATIONS

Brochure entitled "Current and Voltage Transducer Catalog", Third Edition published by LEM U.S.A., Inc. of Milwaukee, Wisconsin, pp. 14–15 and pp. 96–97 (considered w/o date).

International Search Report dated May 21, 1997, PCT Appl. No. PCT/US96/20196.

Milkovic, "Split–Conductor Current Sensors with Electronic Load Termination," IEEE Transactions on Instrumentation and Measurement, vol. 41, No. 4, Aug. 1992.

Smith et al., U.S. Patent Application Serial No. 08/575,300, filed Dec. 20, 1995, entitled "Current Sensing Device".

Smith et al., U.S. Patent Application Serial No. 08/806,970, filed Feb. 26, 1997, entitled "Ratiometric Current Sensor".

Smith et al., U.S. Patent Application Serial No. 08/806,963, filed Feb. 26, 1997, entitled "Method of Fabricating a Magnetic Flux Concentrating Core".

*Primary Examiner*—Michael L. Gellner
*Assistant Examiner*—Karl Easthom
*Attorney, Agent, or Firm*—Marshall, O'Toole, Gerstein, Murray & Borun

[57] ABSTRACT

A conductive bus member operable over a selected operating frequency range includes a cylindrical main body and first and second legs secured to the main body at first and second points whereby first and second current paths having first and second impedances are defined between the first and second points. A predetermined relationship between the first and second impedances is maintained over the selected operating frequency range.

18 Claims, 8 Drawing Sheets

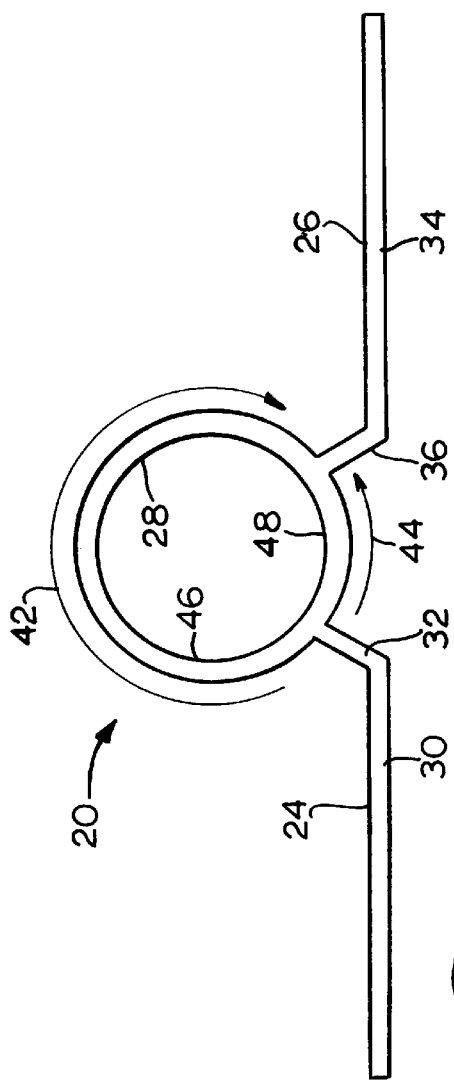
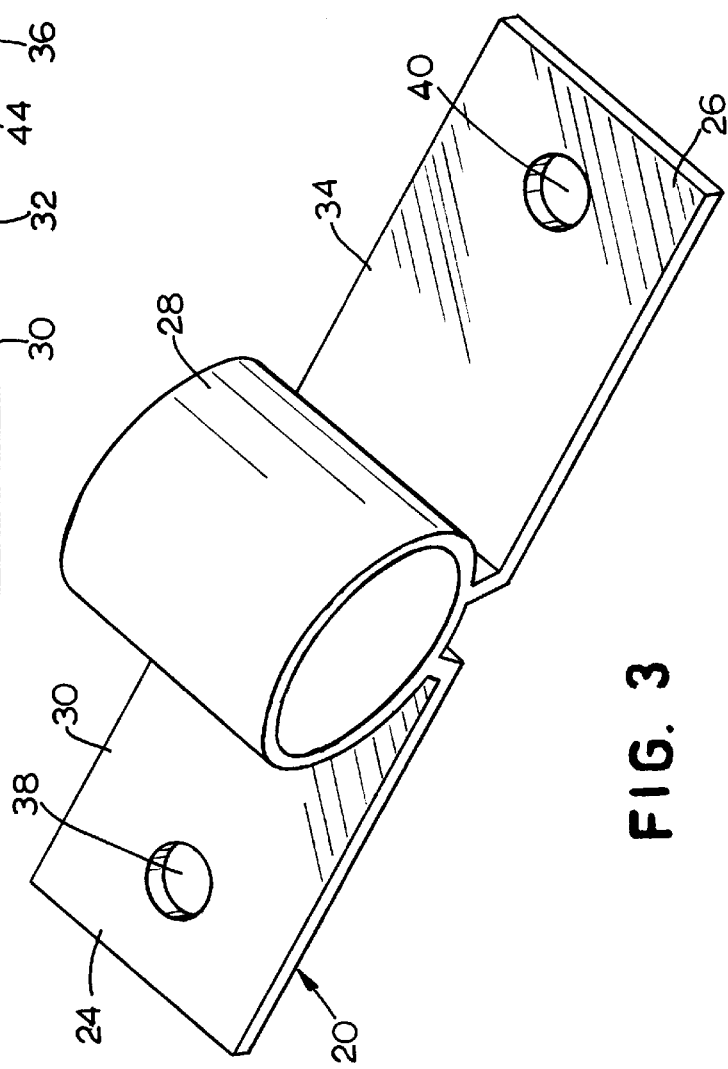
FIG. 4
FIG. 3

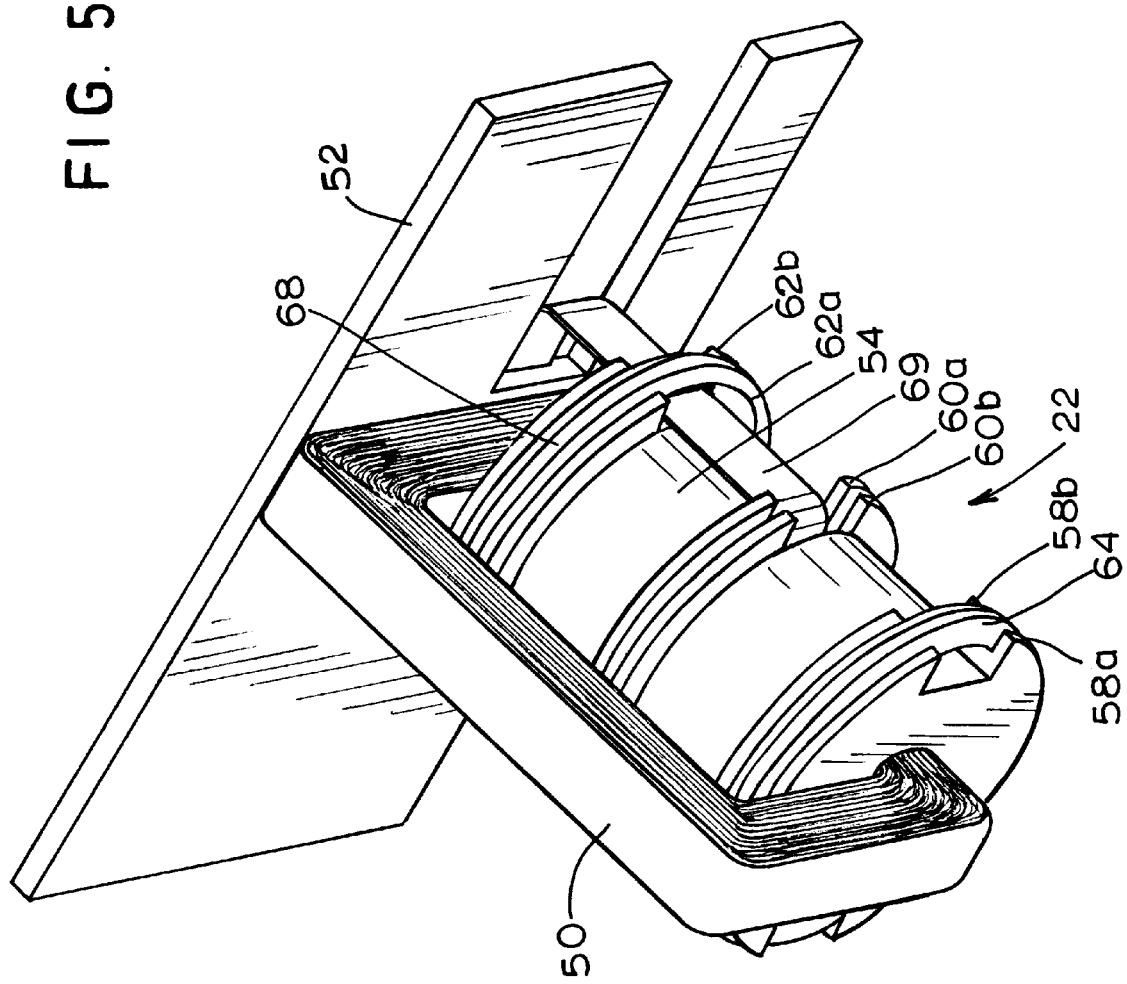

CONDUCTIVE BUS MEMBER AND METHOD OF FABRICATING SAME

TECHNICAL FIELD

The present invention relates generally to electrical conductors, and more particularly to a conductive bus member and a method of fabricating same.

BACKGROUND

Electric power generation and distribution systems as employed in the aerospace field typically provide a centralized mechanism to effectively distribute electric power generated from multiple power sources to multiple electrical loads on an aircraft. The power sources may include primary, auxiliary and emergency generators driven by propulsion engines or turbines. The type of electrical loads requiring power for a given aircraft can vary depending on a military or commercial application. Generally, most modern aircraft have numerous flight critical loads such as avionic equipment required for communication and navigation, electromechanical actuation equipment required for manipulation of flight control surfaces, and electric motor driven fuel pumps and control valves. In addition, power may be required for environmental control(s) and de-icing and lighting equipment. All of these can contribute to safety and basic functioning of the aircraft. Moreover, in any particular application, other loads may be present, such as the modern galley conveniences of a commercial airliner or the sophisticated weaponry of a military fighter jet.

Within such a complex and variable electric power system environment, it is sometimes desirable to monitor both the configuration and safe operation of the system. This monitoring can, for example, include determining if the output voltage is controlled within a certain range needed by the loads. By measuring or sensing the amount of current flowing at various points in the system, one can determine whether a voltage drop has occurred and thus, whether an adequate power output level is being sustained for proper functioning of the aircraft systems. In addition, by sensing the level of current in the system at both an input and an output, protection against overloading the entire power and distribution system can be achieved. Without this protection against an overload condition, a fault may develop in one of the various power units. Differential current protection can also be undertaken to determine if a short circuit condition has arisen.

As the electric power levels and complexity of the distribution systems for aircraft increases, a need exists for the capability to measure current at increased power levels. In addition, the ability to sense current magnitude(s) over a broad band of frequencies is often needed, such as where variable frequency power generation and utilization devices are employed.

One method which has previously been used to measure AC current involves the use of a sense winding having an iron core. However, in the case where high current magnitudes are to be sensed, a sense winding with a large number of turns is needed along with a large iron core to avoid premature saturation. As the number of turns is increased along with the core size, an extremely bulky and heavy assembly is created. This significantly adds to the cost of the system, and may even be unworkable for an aircraft depending on spatial and weight constraints.

A device for sensing current in the electric utility industry is been disclosed by Wolf et al. U.S. Pat. No. 4,182,982. In order to measure utility power line current to monitor consumer usage, a transducer is employed which includes a conductive current divider having a branch path. A compensated transformer arrangement is inductively coupled to the branch path. In addition, a magnetic flux balancing arrangement, which includes an amplifier circuit, is provided to virtually compensate the magnetic flux produced by the transformer and provide an output signal. While the Wolf et al. patent teaches sensing current in a fixed frequency system of 60 Hz, there is no disclosure that the device is suited for sensing current in a DC circuit or other frequencies in an AC circuit, as are typically found in the environment of an aircraft electric power generating system.

One such aircraft generating system involves a variable speed, constant frequency (VSCF) system in which a variable speed prime mover (i.e., the engine of the aircraft) mechanically drives a synchronous generator at a variable speed. Because the generator is driven at a variable speed, the frequency of the output power developed thereby is similarly variable. This variable frequency power is typically converted by a rectifier circuit into DC power. An inverter then inverts the DC power from the rectifier circuit into constant frequency AC output power. The sensor disclosed in the Wolf et al. patent would not be useful to sense DC current levels since DC has no frequency component, and hence no magnetic coupling with the transformer in the branched path can occur to provide a compensated output signal. Moreover, the Wolf et al. device utilizes a conductor having a constant cross section throughout and thus may not necessarily provide the desired performance over the broad frequency band needed to adequately monitor aircraft loads.

SUMMARY OF THE INVENTION

A conductive bus member maintains a certain relationship between first and second impedances in first and second current paths over a selected operating frequency range. A current sensor utilizing such a conductive bus member is thus particularly useful in those situations where current is to be measured over the operating frequency range.

According to one aspect of the present invention, a method of fabricating a conductive bus member includes the steps of forming a main body and first and second legs joined to the main body and selecting a dimension for the main body in accordance with a current magnitude to be conducted.

Other aspects and advantages of the present invention will become apparent upon consideration of the following drawings and detailed description of the preferred embodiments.

BRIEF DESCRIPTION OF THE DRAWINGS

FIG. 3 is a trimetric view of the conductive bus member of the present invention forming a part of the current sensor of FIG. 2;

FIG. 4 is an elevational view of the conductive bus member of FIG. 3;

FIG. 5 is a trimetric view of the current sensor of FIG. 2 without the conductive bus member of FIG. 3;

DESCRIPTION OF THE PREFERRED EMBODIMENTS

Figure 1:
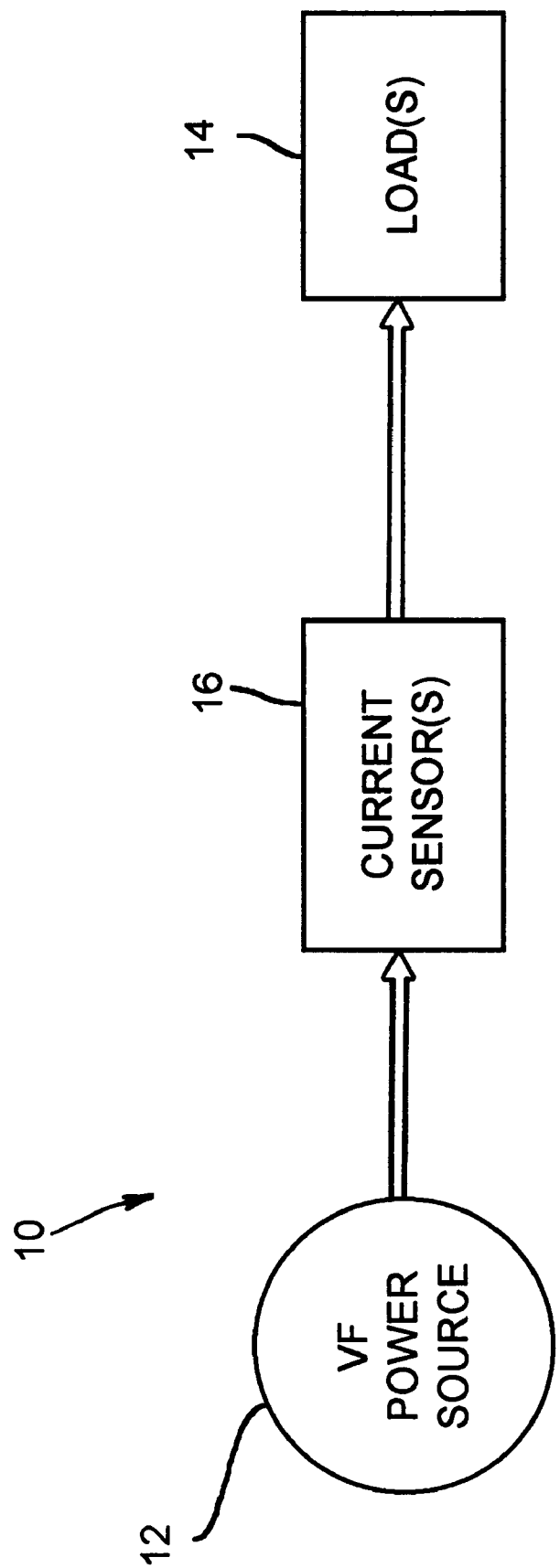
FIG. 1 is a block diagram of a power supply system incorporating a current sensor utilizing the present invention.

Referring now to FIG. 1, a power supply system 10 includes a variable frequency power source 12 which may comprise, for example, a motor drive, a synchronous generator driven at a variable speed, or the like. The power source 12 develops variable frequency power which is supplied to one or more loads 14. The power developed by the power source 12 may be single phase or polyphase and one or more current sensors 16 may be coupled between the power source 12 and the loads 14 to sense the current magnitude delivered to the latter. A signal representing current magnitude may be provided by the current sensor(s) 16 to a utilization device, such as a control unit (not shown), which controls the power source 12.

It should be noted that the current sensor 16 may be used in other types of systems, for example, in a differential protection control circuit wherein current magnitudes at first and second points defining the boundaries of a current detection zone are sensed for protection purposes.

Figure 2:
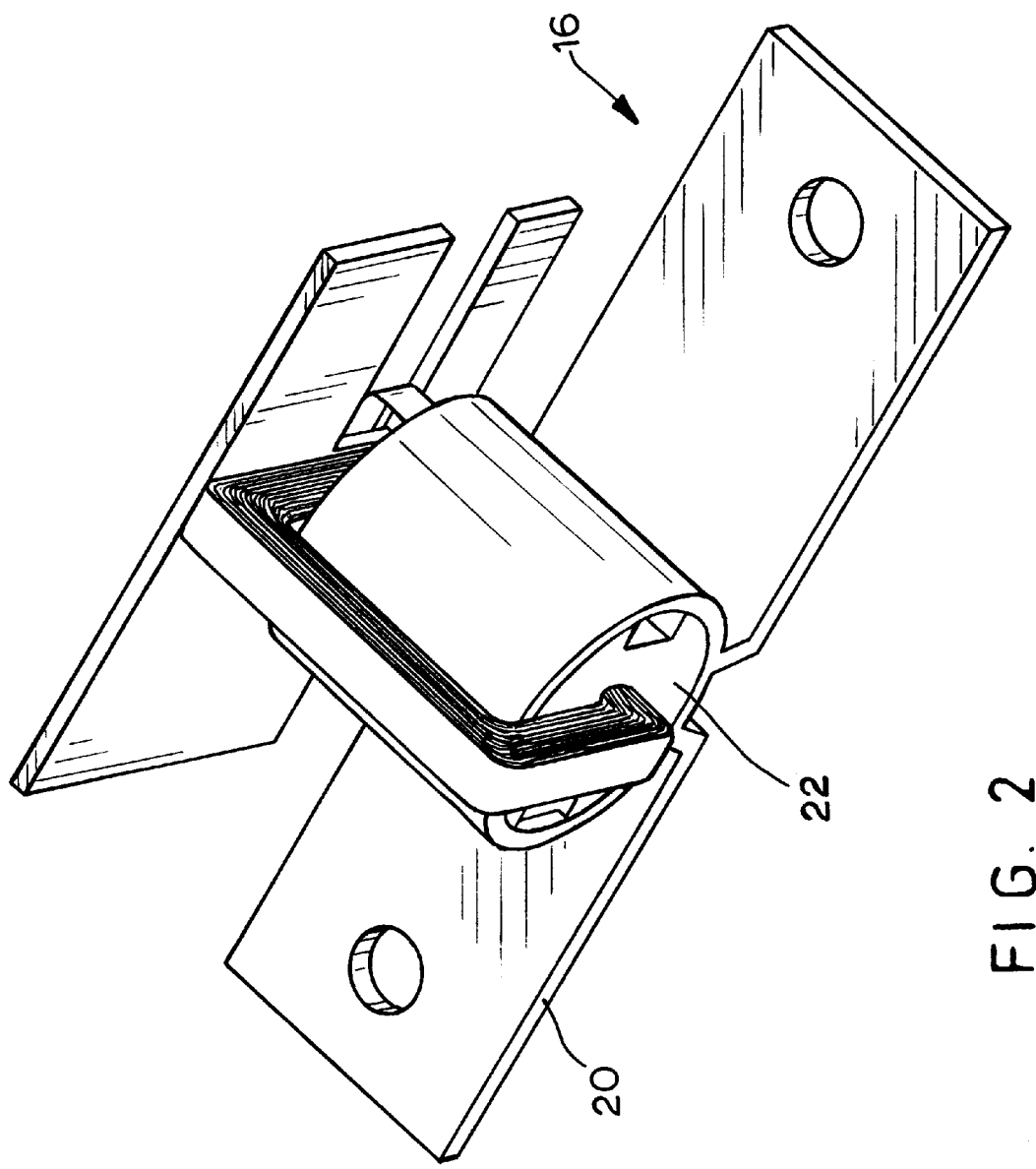
FIG. 2 is a trimetric view of a current sensor which may be used in the system of FIG. 1.

FIG. 2 illustrates one of the current sensors 16 of FIG. 1. The current sensor 16 includes a conductive bus member 20 and a bobbin assembly 22. Referring also to FIG. 3, the conductive bus member 20 includes first and second conductors in the form of legs 24, 26 and a cylindrical main body 28. Preferably, the main body 28 is circular in cross-section, as seen in FIG. 4. Further, the conductive bus member 20 is preferably extruded or otherwise formed and may be trimmed or otherwise provided with an elongate axial extent which is determined in accordance with the maximum current magnitude to be conducted and sensed.

With specific reference to FIG. 4, the leg 24 includes a main leg portion 30 and an auxiliary leg portion 32 which is joined to and extends from the main leg portion 30 and which further joins to the main body 28. Preferably, the portion 32 is normal to the main body 28 at the point at which such portion joins the main body 28.

In like fashion, the leg 26 includes a main leg portion 34 and an auxiliary leg portion 36 which extends from the main leg portion 34 and which joins the main body 28, preferably at an angle which is normal to the main body 28. Also preferably, first and second mounting holes, 38, 40 are formed in the legs 24, 26.

Further in accordance with the preferred embodiment, the conductive bus member 20 is formed of a homogeneous material, such as copper, which is extruded or otherwise formed into the desired shape. Alternatively, a different material may be used, such as aluminum or any other electrically conductive material. Still further in accordance with the preferred embodiment, the wall thicknesses of the various portions of the conductive bus member 20 are constant throughout each portion and the thicknesses of the various portions are equal. Also in accordance with the preferred embodiment, the axial extents of the various portions are equal. Under these conditions, a relationship may be established and maintained between the impedances in first and second current paths represented by arrows 42 and 44 in portions 46, 48 of the main body 28 wherein the current paths extend between the points at which the portions 32 and 36 join the main body 28. This relationship is expressed by the equation L1/R1=L2/R2, where L1 and R1 are the inductance and resistance, respectively, in the first path represented by the arrow 42 and L2 and R2 are the inductance and resistance, respectively, in the second path represented by the arrow 44. When this relationship is established, current in the first path represented by the arrow 42 is a fixed fraction of the current magnitude flowing in the path represented by the arrow 44 substantially irrespective of frequency within a specified frequency range. This ratiometric relationship is determined by the difference in path lengths of the first and second paths, and, more specifically, the ratio of the length of the first path to the length of the second path.

It should be noted that the conductive bus member may have a different physical arrangement of portions, for example portions which have different thicknesses, axial extents, equal or unequal path lengths, non-homogenous materials in the first and second paths, holes or other voids formed in one or both paths, etc . . . provided that at least first and second current paths are provided and some means is provided to insure that the magnitude of current in one of the paths is a predetermined fraction of the magnitude of current in the other path over a selected frequency range.

FIG. 5 illustrates the bobbin assembly 22 in greater detail. A core 50 comprising a series of laminations (shown in FIGS. 7–10) is secured to a base plate 52 by any convenient means. The core extends into a bobbin 54. A winding (not shown) is disposed within the bobbin 54 and surrounds the core 50. The bobbin 54 includes a main body 56 including pairs of spaced circumferential flanges 58a, 58b, 60a, 60b and 62a, 62b defining grooves, two of which receive O-rings 64, 68. The O-rings 64, 68 are compressed within the main body 28 and thus retain the bobbin assembly 22 in the main body 28 by friction.

Disposed in the bobbin 54 within a gap of the core 50 is a Hall effect sensor 200 which detects the magnetic field flux magnitude conducted by the core 50. In response to this flux magnitude, the winding in the bobbin 54 is provided current at a level which causes the winding to develop a bucking magnetic field which cancels the magnetic flux in the core 50. The leads for supplying bucking current to the winding and for conducting current developed by the Hall effect sensor may be located on a flexible printed lead strip 69 which enters the bobbin 54 at an opening between the flanges 60a, 60b. Alternatively, separate wires could be used, if desired.

Figure 6:
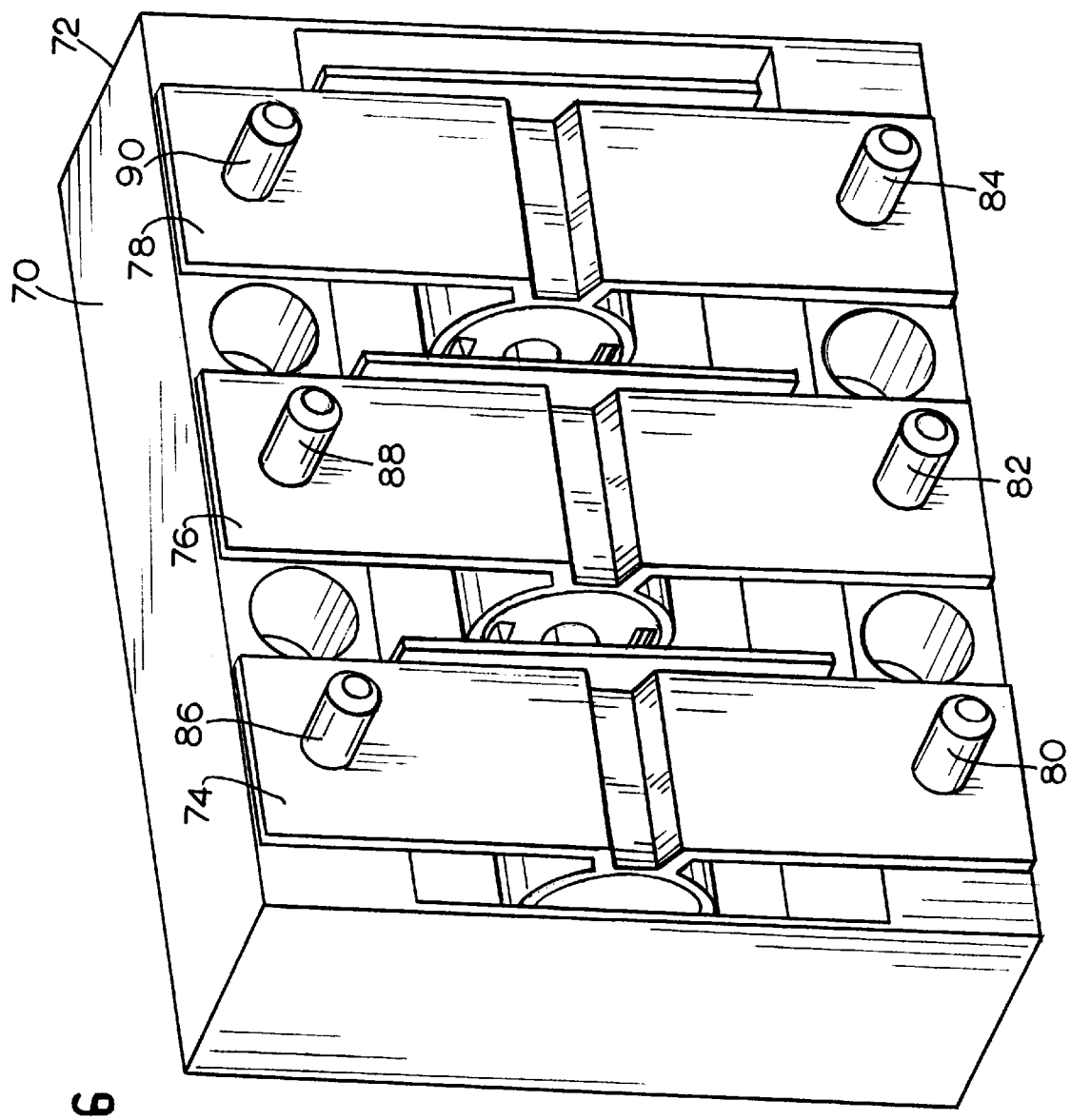
FIG. 6 is a trimetric view of an assembly incorporating three current sensors each like that shown in FIG 2.

FIG. 6 illustrates a three-phase current sensor assembly 70 including a housing 72 and first, second and third current sensors 74, 76, 78, each identical to the current sensor 16 of FIG. 2. The phase currents flow through first and second sets of sensor terminals 80, 82, 84 and 86, 88, 90, respectively. The current sensors 74, 76, and 78 are disposed in side-by-side relationship in the housing 72 and provide a particularly compact assembly of components.

In order to insure that the foregoing relationship of impedances in the two current paths is maintained, it is necessary to provide a well-defined point at which current bifurcation occurs between the auxiliary portions 32 and 36 and the current paths in the main body 28. One way to achieve this result is to orient the auxiliary portions normal to the outer surface of the main body 28 where such portions join the body 28 and to arrange the auxiliary portions 32, 36 relative to the main body 28 such that the lines defined by the points at which the auxiliary portions 32, 36 are attached to the main body 28 are parallel to the central longitudinal axis of the main body 28. Because the two auxiliary portions 32, 36 are preferably (although not necessarily) perpendicular to the main body 28, the current will flow 180° onto/from the two paths. This controlled edge of current bifurcation provides a constant and repeatable ratio dependent upon the relative radial relationship of the bifurcation points. Because the main body 28 is uniform and round, the natural geometric relationship between the first and second current paths maintains the preselected current magnitude ratio in the current paths regardless of the points of current ingress and egress as long as such points are perpendicular to the surface of the main body portion 28.

While in the preferred embodiment the auxiliary portions are normal to the main body 28, it should be noted that this need not be the case, and either or both auxiliary portions may instead be disposed at some other angle(s) relative to the main body 28.

Figure 7:
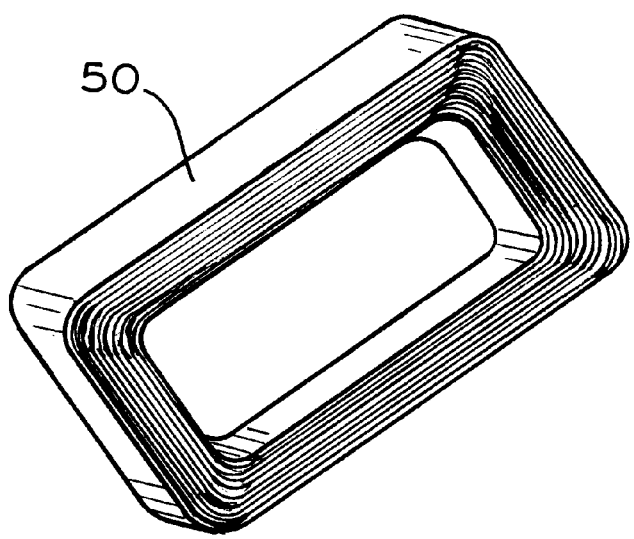
FIGS. 7–10 are trimetric views of the core of the sensor of FIG. 2 during the steps of fabrication and installation thereof.
Figure 8:
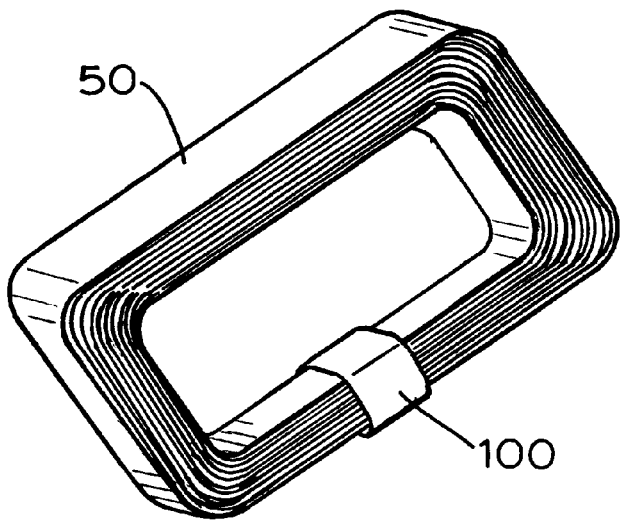
Figure 9:
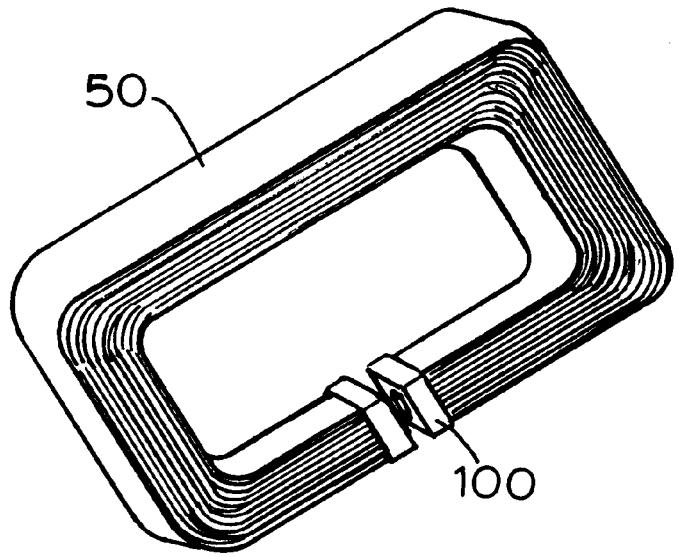
Figure 10:
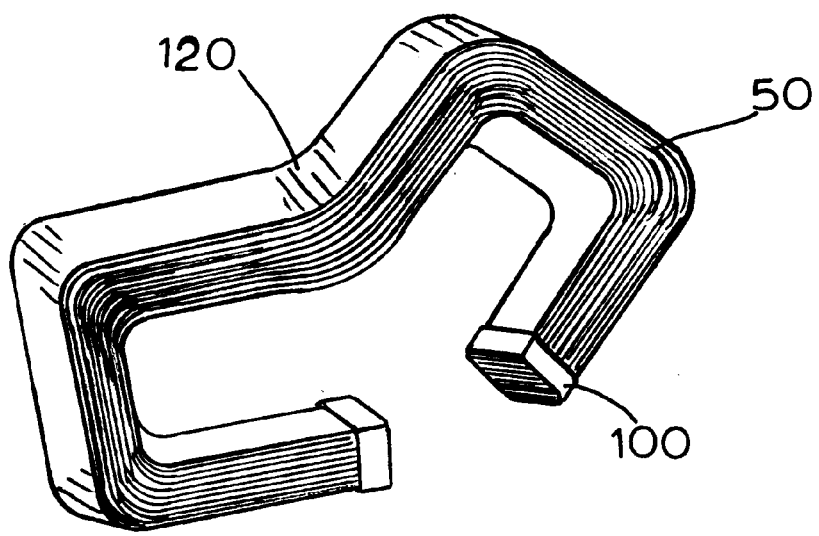

FIGS. 7–10 illustrate the core 50 in greater detail, and further illustrate the step of fabrication and assembly thereof. As noted previously, the core 50 includes a plurality of magnetic steel laminations which are tape-wound with the desired number of layers and which together form a pseudo-rectangular ring, as seen in FIG. 7. Once the required number of layers are formed, the multiple layers are firmly held together by any of a number of alternative means. In the illustrated embodiment, an epoxy impregnated fiber 100 is wrapped tightly around one of the long legs of the core 50 and is then cured. The core is then sawn at the location where the cured fiber is wound, leaving a gap having a width equal to the width of the saw cut. Multiple cuts can be made for wider gaps. Such an operation leaves a squared-off "C" core that can be expanded as seen in FIG. 10 due to the natural resilience of the steel laminate material. When flexed as seen in FIG. 10, the laminations at the unbound side 120 of the core 50 slightly separate and thereafter spring back to the original position as seen in FIG. 9 when inserted into the bobbin 54, reforming a controlled gap.

From the foregoing, it can be seen that the core 50 can be easily handled as one piece. This fabrication and assembly process is applicable not only to the device shown in the present figures, but also could be employed in any application where a single-gap core is to be used in a device for magnetic concentration purposes.

In some cases, the equality of the impedance ratios L1/R1 and L2/R2 can be difficult to achieve or can be upset by external influences. In the latter case this can be caused by local magnetic shielding or magnetic concentrators in the vicinity of the current sensor which can change the inductance in one or both paths, or may result from "parasitic" loading caused by residual offsets introduced by the bucking circuitry. These influences can limit the high frequency band pass accuracy of the current sensor.

Alternatively or in addition, manufacturing tolerances can result in production of devices having other than the desired impedance ratio equality.

Figure 11:
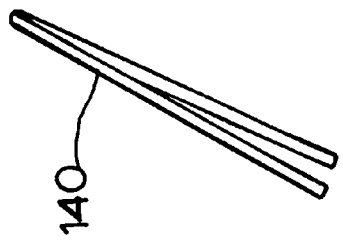
FIG. 11 is a trimetric view of a ferromagnetic clip which may be used with the current sensor of FIG. 2.
Figure 12:
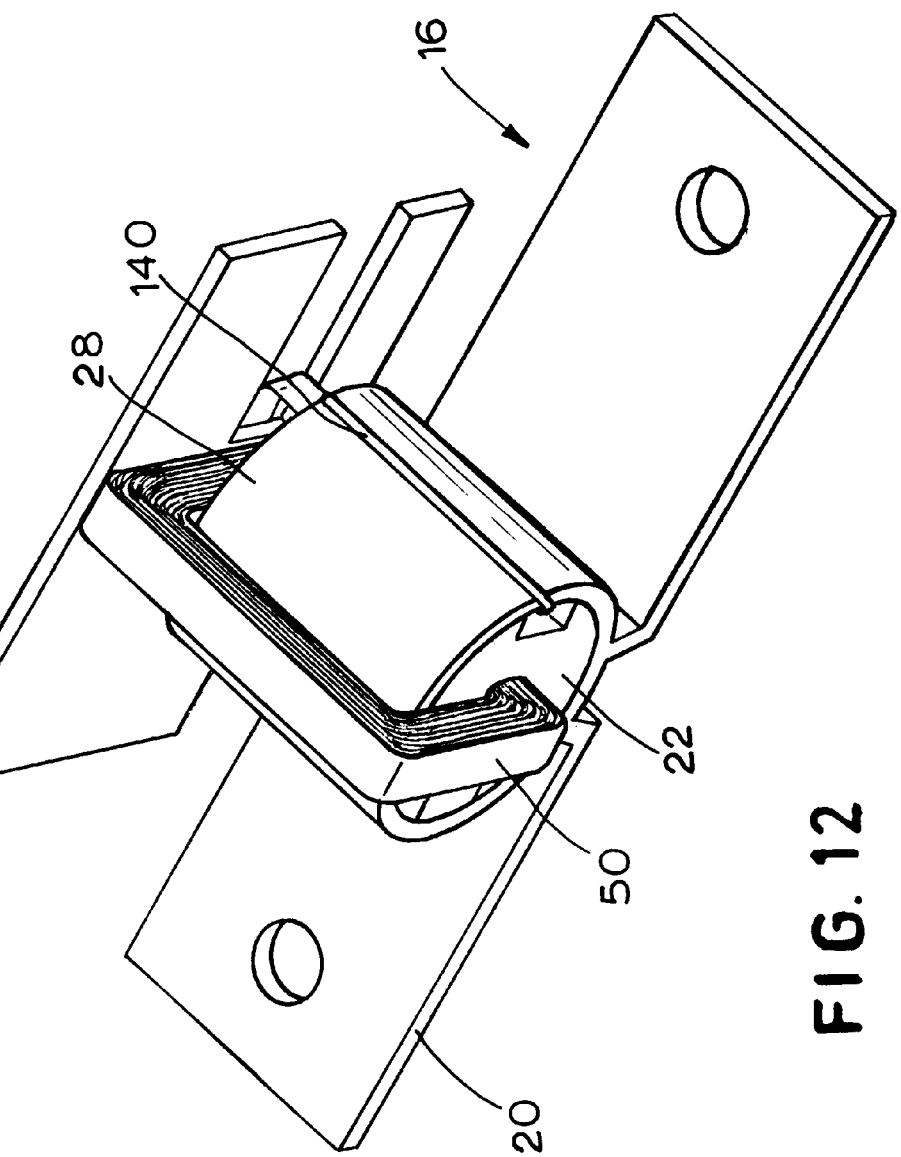
FIG. 12 is a trimetric view of the current sensor of FIG. 2 with the clip of FIG. 11 added thereto.

In order to restore the equality of the impedance ratios in the two paths, an auxiliary body or clip 140 as seen in FIGS. 11 and 12 can be used. The clip 140 may be made of a ferrous material(such as magnetic steel) or other magnetically permeable material which is inserted onto one of the current paths to add a small amount of inductance and thereby balance the impedance ratios of the two paths. The clip is preferably adjusted so that it is parallel to the longitudinal axis of the main body 28 to precisely compensate for any insertion losses caused by extraneous inductive coupling by external circuitry or other elements. When proper balance in the two current paths is achieved, the clip is permanently staked or glued into place.

If desired, any impedance ratio imbalance can be partially or wholly eliminated by changing the resistance of one or both of the current paths. This can be accomplished by varying the thickness and/or axial extent of portions of the path(s), by providing one path with dimension(s) that are different than corresponding dimension(s) of the other path and/or by removing material to create voids that extend partially or fully through the path. This last option may be accomplished by any of a number of manufacturing methods, including cutting, milling, drilling, etc . . . using any suitable means to effectuate this result.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights of all modifications which come within the scope of the appended claims are reserved.

We claim:

1. A method of fabricating a current sensor, the method comprising the steps of:

forming a conductive bus member having a length and an axial extent transverse to the length and further having a main body and first and second legs joined to the main body and wherein the main body includes a hollow interior bounded by separate portions defining first and second current paths having first and second impedances, respectively, and wherein each of the first and second impedances has a nonzero resistance and a nonzero reactance and the first and second impedances have a substantially constant relationship relative to one another so that current in the first current path has a magnitude which is a fixed fraction of a current magnitude in the second current path over a nonzero range of frequencies;

selecting a dimension for the axial extent in dependence upon a current magnitude to be conducted by the conductive bus member;

placing a current sensing element in the hollow interior; and placing a core about the main body and extending into the hollow interior in proximity with the current sensing element.

2. The method of claim 1, wherein the step of selecting comprises the step of trimming the conductive bus member.

3. The method of claim 1, wherein the step of forming comprises the step of extruding the main body and the first and second legs.

4. The method of claim 1, including the further step of adding an auxiliary body of magnetic material to the main body.

5. The method of claim 4, wherein the step of adding comprises the step of placing the auxiliary body on one of the current paths.

6. The method of claim 1, including the further step of removing material from at least one of the current paths.

7. A method of fabricating a conductive bus member, comprising:

forming a cylindrical main body and first and second conductors joined to the main body at spaced points on the cylindrical main body wherein first and second current paths are defined in separate portions of the main body and wherein each current path has an impedance including a nonzero resistance and a nonzero reactance; and adjusting the impedances of the first and second current paths in accordance with a desired ratio of current magnitudes in the first and second current paths over a nonzero range of frequencies.

8. The method of claim 7, wherein the step of forming comprises the step of extruding the main body and the first and second legs.

9. The method of claim 7, wherein the step of adjusting comprises the step of adding an auxiliary body of magnetic material to the main body.

10. The method of claim 9, wherein the step of adding comprises the step of placing a ferromagnetic clip onto one of the first and second current paths.

11. The method of claim 7, wherein the step of adjusting comprises the step of removing material from at least one of the first and second current paths.

12. The method of claim 7, including the further step of selecting an axial extent for the main body in accordance with a current magnitude to be sensed by the current sensor.

13. A current sensor, comprising:

a cylindrical main body having a hollow interior;

a current sensing device disposed in the hollow interior;

first and second conductors joined to the main body at spaced points wherein the main body includes separate portions defining first and second separate current paths having first and second impedances, respectively, and wherein the first and second impedances have a relationship relative to one another to cause a constant ratio of current magnitudes to be coducted in the first and second current paths over a nonzero frequency range; and a core magnetically linking one of the first and second current paths and the current sensing device.

14. The conductive bus member of claim 13, wherein the first and second conductors comprise first and second legs and wherein the main body is cylindrical.

15. The conductive bus member of claim 14, further including an auxiliary body of magnetically permeable material on the main body.

16. The conductive bus member of claim 15, wherein the auxiliary body comprises a ferromagnetic clip having a pair of legs in contact with the main body.

17. The conductive bus member of claim 13, wherein material has been removed from the main body.

18. The conductive bus member of claim 13, wherein the main body has a length and an axial dimension transverse to the length for accommodating a current magnitude.

* * * * *